United States Patent
Shim et al.

(10) Patent No.: US 8,115,259 B2
(45) Date of Patent: Feb. 14, 2012

(54) THREE-DIMENSIONAL MEMORY DEVICE

(75) Inventors: Sunil Shim, Gyeonggi-do (KR); Hansoo Kim, Gyeonggi-do (KR); Jaehoon Jang, Gyeonggi-do (KR); Jaehun Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 260 days.

(21) Appl. No.: 12/694,339

(22) Filed: Jan. 27, 2010

(65) Prior Publication Data

US 2010/0193861 A1 Aug. 5, 2010

(30) Foreign Application Priority Data

Feb. 2, 2009 (KR) .................. 10-2009-0007945

(51) Int. Cl.
*H01L 21/70* (2006.01)
(52) U.S. Cl. ................. 257/390; 257/401; 257/E29.052
(58) Field of Classification Search .................. 257/390, 257/401, E29.052
See application file for complete search history.

(56) References Cited

U.S. PATENT DOCUMENTS

2008/0173928 A1 7/2008 Arai et al.
2009/0310425 A1* 12/2009 Sim et al. ................. 365/185.29

FOREIGN PATENT DOCUMENTS

| JP | 10-032269 | 2/1998 |
| JP | 10-093083 | 4/1998 |
| JP | 2007-180389 | 7/2007 |
| JP | 2007-317874 | 12/2007 |
| JP | 2008-159699 | 7/2008 |
| KR | 10-0521386 B1 | 10/2005 |
| KR | 10-0921287 B1 | 10/2009 |

* cited by examiner

*Primary Examiner* — Minh-Loan T Tran
(74) *Attorney, Agent, or Firm* — Myers Bigel Sibley & Sajovec

(57) ABSTRACT

A three-dimensional semiconductor device includes a semiconductor substrate, vertical channel structures arranged on the semiconductor substrate in a matrix, a P-type semiconductor layer disposed at the semiconductor substrate to be in direct with the vertical channel structures, and a common source line disposed at the semiconductor substrate between the vertical channel structures. The common source line may be in contact with the P-type semiconductor layer.

10 Claims, 27 Drawing Sheets

Fig. 3

|  | Program | Erase | Read |
|---|---|---|---|
| Sel WL | Vp | GND | GND |
| Unsel BL | Vpass | GND | Vread |
| Sel BL | GND | GND | Vpchr |
| Unsel BL | Vcc | GND | GND |
| SSL | Vcc | Floating/GND | Vread |
| GSL | Vcc | Floating/GND | Vread |
| CSL | GND | Floating | GND |
| Bulk/Pillar | GND | Verase | GND |

THREE-DIMENSIONAL MEMORY DEVICE

REFERENCE TO PRIORITY APPLICATION

This application claims priority to Korean Patent Application No. 10-2009-0007945, filed Feb. 2, 2009, the contents of which are hereby incorporated herein by reference.

FIELD OF THE INVENTION

The present inventive concept relates to semiconductor devices and, more specifically, to a three-dimensional memory device.

BACKGROUND

In order to meet ever-increasing needs of the users for superior performance and low costs, there is a requirement for high integration density of semiconductor memory devices. In case of conventional two-dimensional semiconductor memory devices, their integration density is mainly determined by an area occupied by a unit memory cell. Therefore, the conventional two-dimensional semiconductor memory devices are greatly affected by fine-pattern forming technologies. However, because extremely high-priced apparatuses are needed to achieve fine patterns, the integration density of two-dimensional semiconductor memory devices is still limited while continuing to increase.

Various technologies for three-dimensionally forming memory cells have been suggested to overcome the foregoing limitation. According to the technologies, three-dimensionally arranged memory cells allow an area of a semiconductor substrate to be used effectively. For this reason, integration density of the three-dimensional memory device becomes higher than that of a two-dimensional semiconductor device.

SUMMARY

Embodiments of the present inventive concept provides a three-dimensional semiconductor device, which may include a semiconductor substrate, vertical channel structures arranged on the semiconductor substrate in a matrix, a P-type semiconductor layer disposed at the semiconductor substrate to be in direct contact with the vertical channel structures, and a common source line disposed at the semiconductor substrate between the vertical channel structures to be contact with the P-type semiconductor layer.

In some embodiments, the common source line may be doped with N-type impurities.

In some embodiments, the three-dimensional semiconductor device may further include a common source line pad disposed on the semiconductor substrate outside an array region where the vertical channel structures are disposed.

In some embodiments, the common source line may extend in one direction.

In some embodiments, the common source line may be disposed in a matrix

In some embodiments, the three-dimensional semiconductor device may further include a ground selection line disposed on the P-type semiconductor layer to invert a surface of the P-type semiconductor layer.

In some embodiments, each of the vertical channel structures may have a pillar shape or a macaroni shape.

In some embodiments, an interlayer dielectric may be disposed on the common source line.

In some embodiments, the vertical channel structures may include dummy vertical channel structures, and the common source line may extend to a lower portion of the dummy vertical channel structure.

In some embodiments, the common source line may further include at least one of metal silicide and metal.

BRIEF DESCRIPTION OF THE DRAWINGS

The present inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

FIG. 3 shows operation voltages illustrating operations of a semiconductor device according to some embodiments of the present inventive concept.

FIGS. 5A to 11A are cross-sectional views sequentially showing methods of forming the semiconductor device of FIG. 4B.

FIGS. 5B to 11B are cross-sectional views sequentially showing methods of forming the semiconductor device of FIG. 4C.

FIGS. 5C to 11C are cross-sectional views sequentially showing methods of forming the semiconductor device of FIG. 4D.

FIGS. 5D to 11D are cross-sectional views sequentially showing methods of forming the semiconductor device of FIG. 4E.

DETAILED DESCRIPTION OF THE EMBODIMENTS

Figure 1:
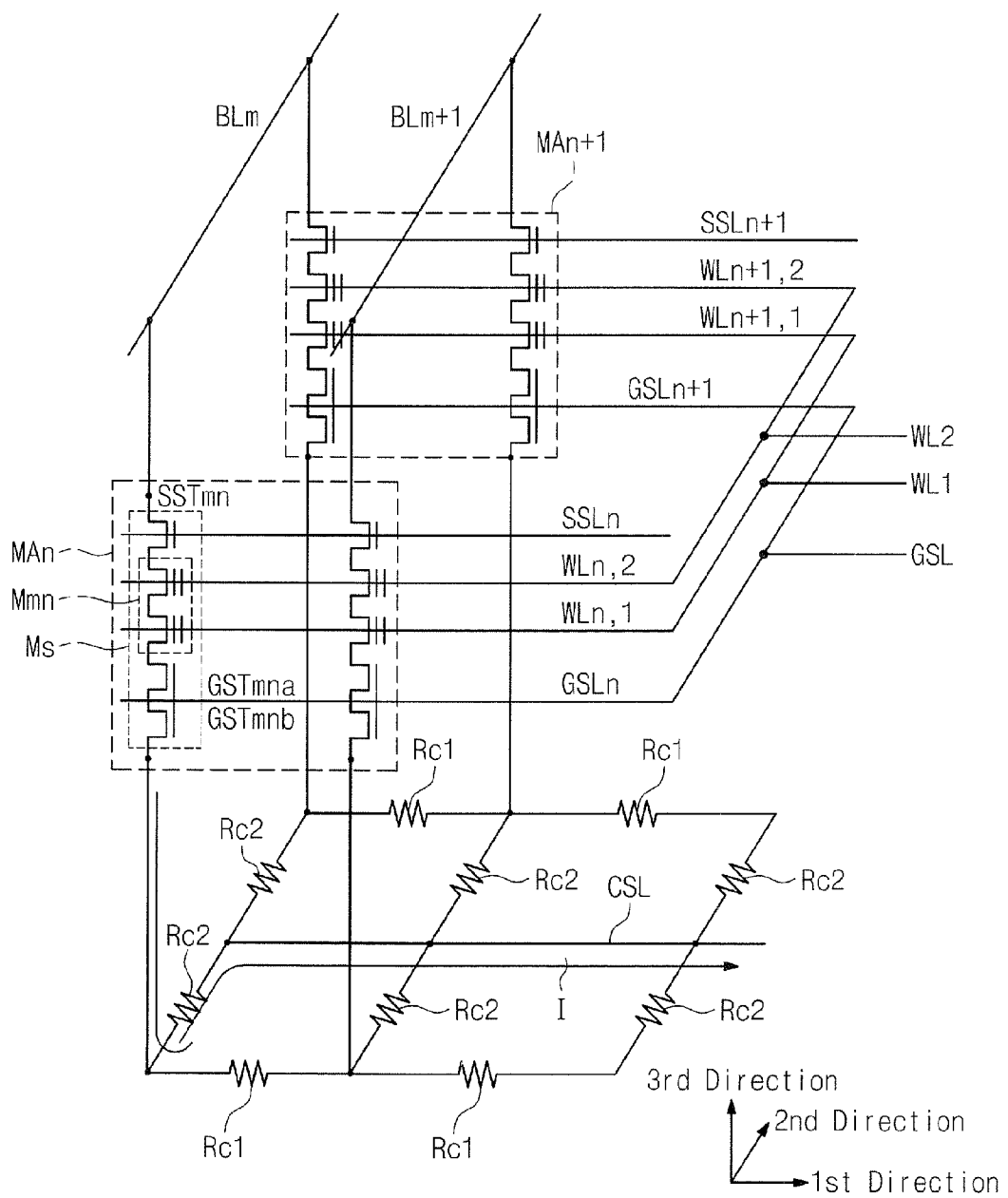
FIGS. 1 and 2 are circuit diagrams of a three-dimensional semiconductor device according to embodiments of the present inventive concept.

Preferred embodiments of the present inventive concept will be described below in more detail with reference to the accompanying drawings. The present inventive concept may, however, be embodied in different forms and should not be constructed as limited to the embodiments set forth herein. Rather, these embodiments are provided so that this disclosure will be thorough and complete, and will fully convey the scope of the present inventive concept to those skilled in the art.

In the specification, the dimensions of layers and regions are exaggerated for clarity of illustration. It will also be understood that when a layer (or film) is referred to as being "on" another layer or substrate, it can be directly on the other layer or substrate, or intervening layers may also be present. Also, though terms like a first, a second, and a third are used to describe various regions and layers in various embodiments of the present inventive concept, the regions and the layers are not limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

A three-dimensional nonvolatile memory device including a vertical channel structure may include an N-type semiconductor layer that is a contact portion of the vertical channel structure and a semiconductor substrate or a P-type semiconductor layer that is a contact portion with the vertical channel structure. The N-type semiconductor layer is used as a common source line without formation of an separate common source line. Each of the vertical channel structures may constitute a memory cell string.

On the other hand, the P-type semiconductor layer is required to form a separate common source line. The common source line is disposed outside an array region where the vertical channel structures are arranged in form of an array. The P-type semiconductor layer is disposed at the array region. Thus, in transistors disposed on the semiconductor substrate, the P-type semiconductor layer may be inverted to form horizontal channels through which the common source line and the vertical channel structures are electrically connected to each other. However, because the horizontal channels between the common source line and the vertical channels structures may have high resistance, current flowing through the common source line may be changed according to the position of the vertical channel structure disposed at the array region. Accordingly, there is a requirement for a great threshold voltage difference based on an information storing state of memory cells. The farther a distance between the common source line and the vertical channel structures, the higher resistance therebetween. As a result, there is a requirement for low resistance between the common source line and the vertical channel structures.

FIG. 1 is circuit diagrams of a three-dimensional semiconductor device according to some embodiments of the present inventive concept.

Referring to FIG. 1, the semiconductor device includes vertical channel structures, which may constitute a memory cell string MS. Memory cell strings MS are disposed on a semiconductor substrate in a matrix to form a three-dimensional memory cell array. The semiconductor device includes a first column memory cell array MAn formed by the memory cells strings MS arranged on a semiconductor substrate (not shown) in a first direction, a second column memory cell array MAn+1 disposed adjacent to the first column memory cell array MAn, and a common source line CSL disposed at the semiconductor substrate between the first column memory cell array MAn and the second column memory cell array MAn+1.

Each of the memory cell strings MS may include a vertical channel structure. These vertical channel structures may vertically extend from the semiconductor substrate. The memory cell string MS may include memory cells Mmn vertically connected in series on the semiconductor substrate, a ground selection transistor GSTmna connected to one end of the memory cells Mmn, an auxiliary ground selection transistor GSTmnb serially connected to the ground selection transistor GSTMna, and a string selection transistor SSTmn connected to the other end of the memory cells Mmn. A gate of the ground selection transistor GSTmna and a gate of the auxiliary ground selection transistor GSTmnb may be shared with each other.

Gates of the memory cells Mmn may be disposed at different layers and extend in the first direction to form wordlines WLn,1 and WLn,2. The wordlines WLn,1 and WLn,2 may have a line shape. The wordlines disposed on the same plane may be connected to main wordlines WL1 and WL2. Gates of the string selection transistor SSTmn may extend in the first direction to form string selection lines SSLn. Gates of the ground selection transistor GSTmna may extend in the first direction to form ground selection lines GSLn and GSLn+1. The ground selection lines disposed on the same plane may be electrically connected to main ground selection lines GSL.

The string selection transistors SSTmn may be electrically connected to a bitline BLm extending in a second direction intersecting the first direction. One transistor of the memory cells Mmn may be accessed by selecting a bitline BLm, a string selection line SSLn, and a wordline WL1.

Bodies of the string selection transistor SSTmn, the memory cells Mmn, and the ground selection transistor GSTmna may be formed at the vertical channel structure. The vertical channel structure may be crystalline or polycrystalline semiconductor. The vertical channel structures may be P-type semiconductor. When the memory cells Mmn, the string selection transistor SSTmn, and the ground selection transistors GSTmna are each turned on, a vertical channel may be formed by forming an inversion area at the vertical channel structure. Thus, the adjacent transistors may be electrically connected through the inversion area (vertical channel).

A body of the auxiliary ground selection transistor GSTmnb may be disposed at the semiconductor substrate doped with P-type impurities. The auxiliary ground selection transistor GSTmnb may be an NMOS transistor. When the auxiliary select transistors GSTb are in a turn-on state by applying a voltage to the ground selection line GSL, they may have an inversion area formed at the semiconductor substrate as a horizontal channel area. The horizontal channel areas of the adjacent auxiliary ground selection transistors GSTb may be electrically connected to each other.

The common source line CSL may be disposed at the semiconductor substrate while coming in contact with the horizontal channel area of the auxiliary selection transistors GSTb. The common source line CSL may be a region doped with N-type impurities. A first parasitic resistor Rc1 may be generated between the auxiliary ground selection transistors GSTb disposed adjacent to each other in the first direction. A second parasitic resistor Rc2 may be generated between the common source line CSL and the auxiliary ground selection transistor GSTb. The first parasitic resistor Rc1 may be greater than the second parasitic resistor Rc2. Current I flowing through a specific memory cell string MS may flow to the common source line CSL through the second parasitic resistor Rc2. Accordingly, a malfunction caused by a parasitic resistor between the memory cell string MS and the common source line CSL may be suppressed.

Figure 2:
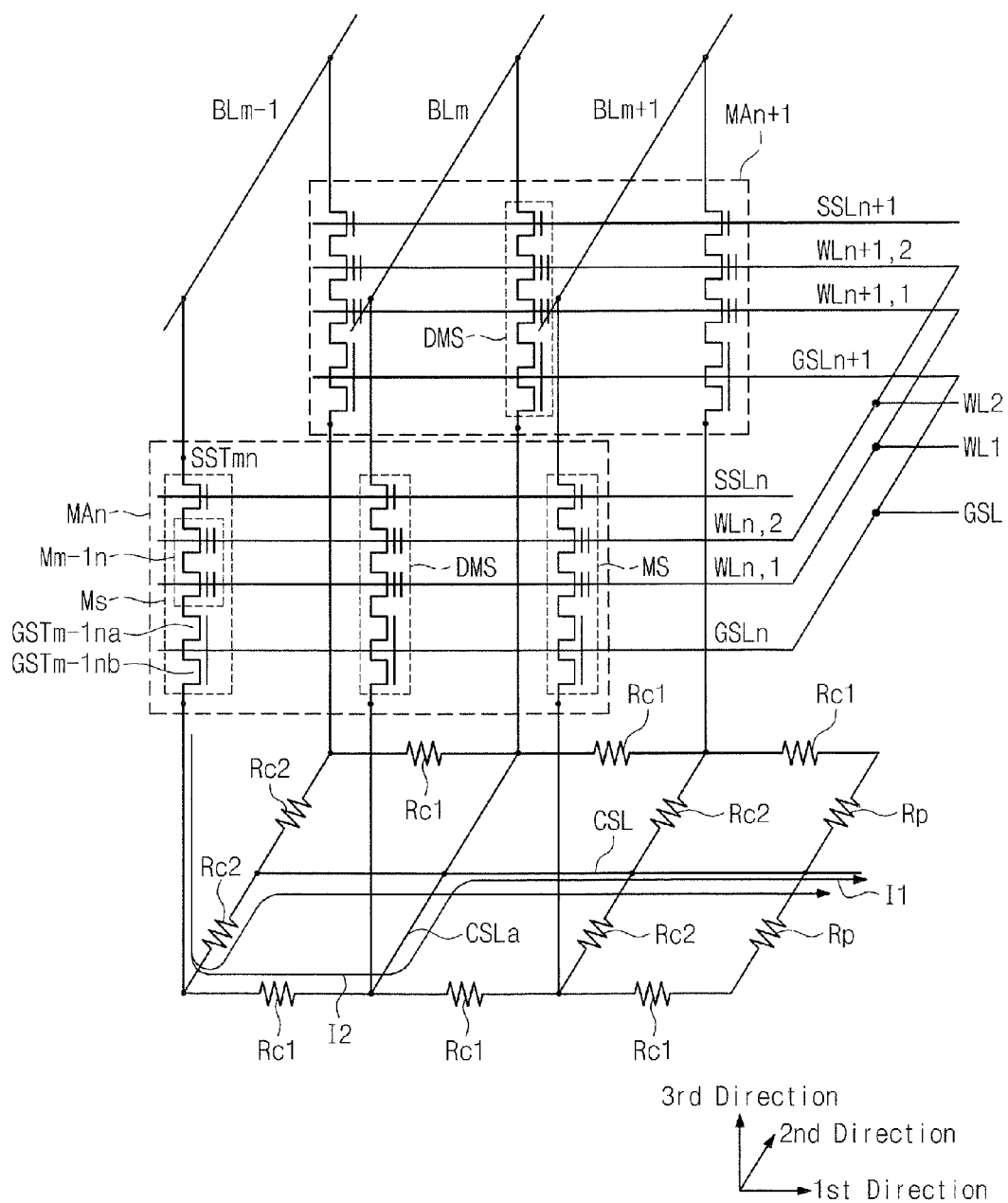

FIG. 2 is circuit diagrams of a three-dimensional semiconductor device according to other embodiments of the present inventive concept. In FIG. 2, duplicate explanations with FIG. 1 will be omitted here.

Referring to FIG. 2, the three-dimensional semiconductor device includes vertical channel structures. Each of the vertical channel structures may constitute a memory cell string MS. The memory cell strings MS are arranged in a matrix to form a three-dimensional memory cell array. The semiconductor device includes a first column memory cell array MAn formed by the memory cells strings MS arranged on a semiconductor substrate (not shown) in a first direction, a second column memory cell array MAn+1 disposed adjacent to the first column memory cell array MAn, and a common source line CSL disposed at the semiconductor substrate between the first column memory cell array MAn and the second column memory cell array MAn+1. At least one dummy memory cell string DMS may be provided between the memory cell strings MS arranged in the first direction. The dummy memory cell strings DMS may be continuously arranged in a second direction intersecting the first direction. An auxiliary common source line CSLa may be disposed at the semiconductor substrate below the dummy memory cell strings DMS. The auxiliary common source line CSLa may have the same configuration and contain the same material as the common source line CSL. The common source line CSL may be an impurity region doped with N-type impurities.

The common source line CSL may be disposed at the semiconductor substrate while coming in contact with the horizontal channel area of the auxiliary ground selection transistors GSTb. The auxiliary common source line CSLa may extend in the second direction while crossing the common source line CSL. In the first direction, a first parasitic auxiliary resistor Rc1 may be generated between the auxiliary ground selection transistors GSTb and the auxiliary common source line CSLa. A second parasitic resistor Rc2 may be generated between the common source line CSL and the auxiliary ground selection transistor GSTb. The first parasitic resistor Rc1 may be nearly equal to the second parasitic resistor Rc2. Current flowing through a specific memory cell string MS may include current I1 flowing through the first parasitic resistor Rc1 and current I2 flowing through the second parasitic resistor Rc2. Therefore, a malfunction caused by a parasitic resistor between the memory cell string MS and the common source line CSL may be suppressed.

FIG. 3 shows operation voltages illustrating operations of a semiconductor device according to some embodiments of the present inventive concept.

Referring to FIGS. 1 and 3, a program operation for a memory cell of a semiconductor device according to some embodiments of the present inventive concept may be performed by selecting a bitline BL, a string selection line SSL, and a wordline WL. A difference between voltages at the selected wordline (Sel. WL) and a channel region of a selected memory cell allows charges to be injected into a charge storage layer of the selected memory cell.

In order to program memory cells independently, a program voltage Vp may be applied to the selected wordline (Sel. WL) corresponding to the selected memory cell and a pass voltage Vpass may be applied to an unselected wordline (Unsel. WL). Thus, the pass voltage Vpass may turn on unselected memory cells. A selected bitline (Sel. BL) may be grounded, and an unselected bitline (Unsel. BL) may be supplied with a power supply voltage Vcc. A selected string selection line (Sel. SSL) is supplied with the power supply voltage Vcc to turn on all string selection transistors SST connected to the selected string selection line (Sel. SSL). Accordingly, a high voltage difference (Vp-GND) may be applied to a gate and a channel region of the selected memory cell and a low voltage difference (Vp-Vcc) may be applied to a gate and a channel region of an unselected memory cell connected to the unselected bitline (Unsel. BL). The high voltage difference (Vp-GND) may allow the selected memory cells to be programmed using tunneling phenomenon.

The unselected string selection line (Unsel. SSL) may be grounded to turn on all selected transistors connected to the unselected string selection line SSL. A self-boosting scheme may prevent memory cells connected to the selected bitline (Sel. BL) and the unselected string selection line (Unsel. SSL) from being programmed unintentionally. The vertical channel structure may function as a body of a conventional semiconductor device. The vertical channel structure may be electrically connected to a semiconductor substrate to be grounded during a program operation.

During an erase operation for the semiconductor device according to some embodiments of the present inventive concept, all memory cells of an array may be erased at the same time. In order to erase all the memory cells at the same time, the vertical semiconductor structure and the semiconductor substrate may be supplied with a positive erase voltage Verase and the wordlines WL may be grounded. The erase voltage Verase may be greater than a program voltage Vp. The vertical semiconductor structure and the semiconductor substrate may the same conductivity type.

A read operation for the semiconductor device according to some embodiments of the present inventive concept may be performed by sensing read current flowing between the string selection transistor SST and a ground selection transistor GSTa. The read current may be dependent upon a threshold voltage based on the number of charges stored in the charge storage layer. A difference of the read current makes it possible to determine information stored in the memory cell MC.

During the read operation, a selected wordline (Sel. WL) may be supplied with a mid value of threshold voltages based on an information storing state or may be grounded. A selected bitline (Sel. BL) may be supplied with a precharge voltage Vpchr, and an unselected bitline (Unsel. BL) may be grounded. The unselected wordlines (Unsel. WL), the string selection line SSL, and the ground selection line GSL may be supplied with a read voltage Vread to turn on transistors connected to the selected memory string. According to a threshold voltage of the selected memory cell, current may flow between the selected bitline (Sel. BL) and the grounded common source line CSL. The current flowing to the selected bitline (Sel. BL) may vary with the information storing state of the selected memory cell.

The operation method of a three-dimensional semiconductor device according to the present inventive concept is merely exemplary for explaining the spirit of the present inventive concept, and features of the inventive concept are not limited thereto. That is, it is apparent to a person of ordinary skill in the art that modifications may be readily made based on related arts. Therefore, the features associated with the operation method may be embodied through various modifications and changes based on the related arts.

A three-dimensional semiconductor device according to some embodiments of the present inventive concept and a method of fabricating the same will now be described below in detail.

Figure 4A:
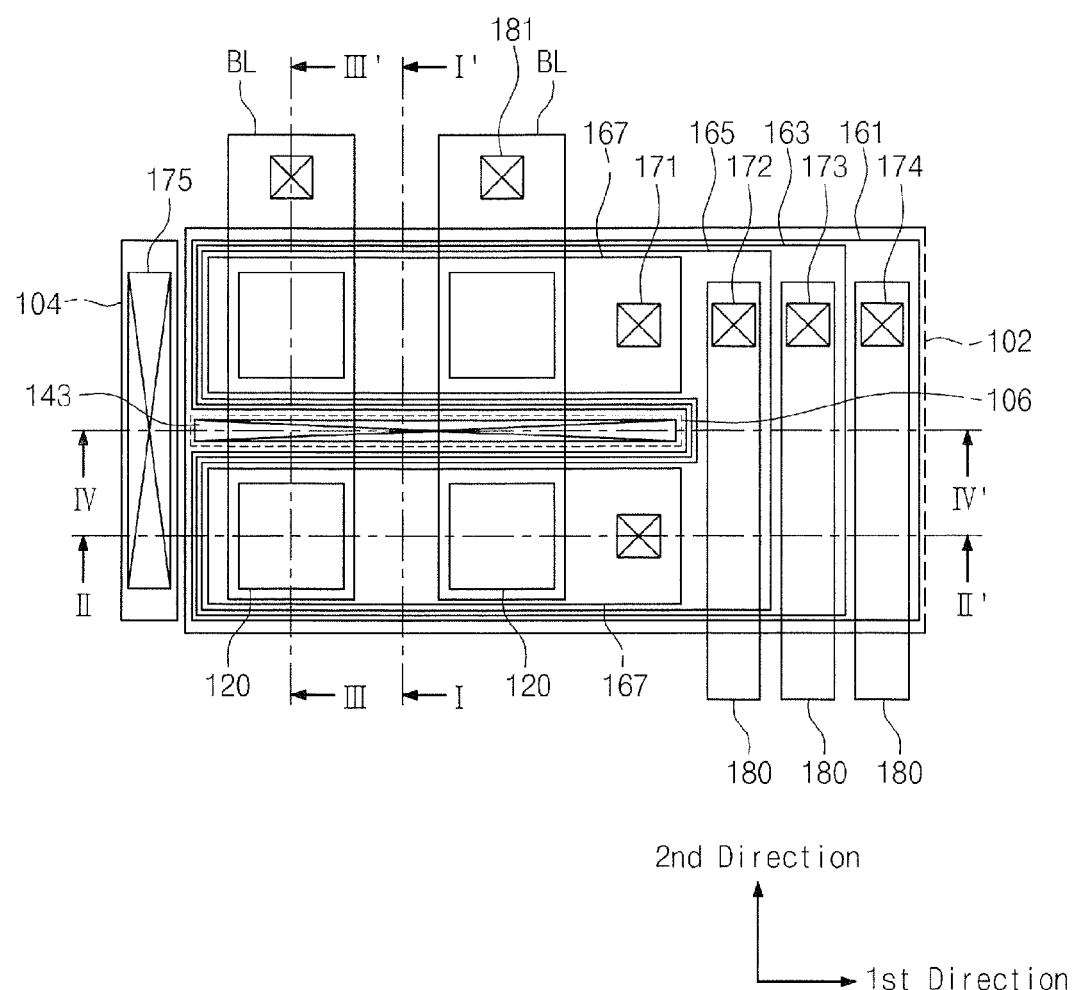
FIG. 4A is a top plan view of a semiconductor device according to some embodiments of the present inventive concept.

FIG. 4A is a top plan view of a semiconductor device according to some embodiments of the present inventive concept. FIGS. 4B, 4C, 4D, and 4E are cross-sectional views taken along the lines I-I', II-II', III-III', and IV-IV' in FIG. 4A, respectively.

Referring to FIGS. 4A to 4E, the semiconductor device includes a semiconductor substrate 100, vertical channel structures 120 disposed on the semiconductor substrate 100 in a matrix, a P-type semiconductor layer 102 that is in direct contact with the vertical channel structures 120 and is disposed on the semiconductor substrate 100, and a common source line 106 disposed on the semiconductor substrate 100 between the vertical channel structures 120. The common source line 106 may be in contact with the P-type semiconductor layer 102.

The P-type semiconductor layer 102 may be disposed at a predetermined region where the vertical channel structures 120 of the semiconductor substrate 100 are disposed. The P-type semiconductor layer 102 may be an impurity region doped with P-type impurities.

The vertical channel structures 120 may be disposed on the P-type semiconductor layer 102 in a matrix. The vertical channel structures 120 may be silicon doped with P-type impurities. The vertical channel structure 120 may be crystalline or polycrystalline silicon. The vertical channel structure 120 may have a pillar shape or a macaroni shape.

The common source line 106 may extend at the semiconductor substrate 100 between the vertical channel structures 120 in a first direction. The common source line 106 may be a region doped with N-type impurities. According to modified embodiments of the present inventive concept, the common source line 106 may include at least one of an impurity region, doped polysilicon, metal silicide, and metal. A top surface of the P-type impurity layer 102 may have the same level as a top surface of the common source line 106.

A common source line contact pad 104 may be disposed in the vicinity of the P-type semiconductor layer 102 to be electrically connected to the common source line 106. The common source line contact pad 104 may include the same material as the common source line 106. The common source line contact pad 104 may be, for example, an N-type impurity region.

Ground selection lines 161, wordlines 163 and 165, and string selection lines 167 may be sequentially stacked on the P-type semiconductor layer 102 and extend in the first direction. The ground selection lines 161 may run parallel to each other on one plane. The ground selection lines 161 may be connected to each other at their one end. The ground selection lines 161, the wordlines 163 and 165, and the string selection lines 167 may be disposed to have a step shape at their one end.

The wordlines 163 and 165 may be disposed on a plurality of planes. The wordlines disposed on one plane may be connected to each other at their one end. In this embodiment, only the wordlines 163 and 165 of a double-layered structure are shown for the convenience of description. Side surfaces of the wordlines 163 and 165 and the ground selection lines 161 may be vertically aligned with each other. Further, side surfaces of the wordlines 163 and 165 and the string selection lines 167 may be vertically aligned with each other. Alternatively, end portions of the ground selection lines 161, wordlines 163 and 165, and string selection lines 167 may not be aligned with each other but form step shapes.

The ground selection lines 161, the wordlines 163 and 165, and the string selection lines 167 may be each made of a conductive material. The ground selection lines 161, the wordlines 163 and 165, and the string selection lines 167 may include at least one of doped polysilicon, metal, and metal silicide.

The vertical channel structure 120 may be disposed to vertically penetrate the string selection line 167, the wordlines 163 and 165, the ground selection line 161. An insulating layer 152 may be disposed between the vertical channel structure 120 and the string selection line 167, between the vertical channel structure 120 and the wordlines 163 and 165, and between the vertical channel structure 120 and the ground selection line 161. The insulating layer 152 between the vertical channel structure 120 and the string selection line 167 may act as a gate insulating layer of the string selection transistor SST. The insulating layer 152 between vertical channel structure 120 and the wordlines 163 and 165 may act as a charge storage layer of cell transistors. The insulating layer 152 between the vertical channel structure 120 and the ground selection line 161 may act as a gate insulating layer of a ground selection transistor GSTa. The insulating layer 152 may extend between the ground selection line 161 and the semiconductor substrate 100. The insulating layer 152 on the semiconductor substrate 100 may act as a gate insulating layer of an auxiliary ground selection transistor GSTb. The insulating layer 152 may include a multi-layered structure of silicon oxide/silicon nitride/silicon oxide to act as the charge storage layer. The structure of the insulating layer 152 may be altered variously.

The wordlines 163 and 165 may include a lower wordline 163 and an upper wordline 165. A first interlayer dielectric pattern 132 may be disposed between the ground selection line 161 and the lower wordline 163, and a second interlayer dielectric pattern 134 may be disposed between the ground selection line 161 and the upper wordline 165. A third interlayer dielectric pattern 136 may be disposed between the upper wordline 165 and the string selection line 167. A fourth interlayer dielectric pattern 138 may be disposed on the string selection line 167.

The insulating layer 152 may extend to be disposed between the ground selection line 161 and the first interlayer dielectric pattern 132. The insulating layer 152 may extend to be disposed between the first interlayer dielectric pattern 132 and the lower wordline 163. The insulating layer 152 may extend to be disposed between the lower wordline 163 and the second interlayer dielectric pattern 134. The insulating layer 152 may extend to be disposed between the second interlayer dielectric pattern 134 and the upper wordline 165. The insulating layer 152 may extend to be disposed between the upper wordline 165 and the third interlayer dielectric pattern 136. The insulating layer 152 may extend to be disposed between the third interlayer dielectric pattern 136 and the string selection line 167. The insulating layer 152 may extend to be disposed between the string selection line 167 and the fourth interlayer dielectric pattern 138.

A gap-fill interlayer dielectric 143 may be disposed between adjacent wordlines 163 and 165 on the common source line 106. The gap-fill interlayer dielectric 143 may extend in the first direction. The gap-fill interlayer dielectric 143 may include silicon oxide. A bottom surface of the gap-fill interlayer dielectric 143 may be in contact with the insulating layer 152. A top surface of the gap-fill interlayer dielectric 143 may have the same height as that of the fourth interlayer dielectric pattern 138.

A drain region 122 may be formed on the vertical channel structures 120. The drain region 122 may be an impurity region doped with N-type impurities. A top surface of the vertical channel structures 121 may have the same height as that of the gap-fill interlayer dielectric 143. A bitline BL may be disposed on the drain region 122. The bitline may extend in the second direction intersecting the first direction.

An outer interlayer dielectric 142 may be disposed on the semiconductor substrate 100 at an outer region except a predetermined region where the vertical channel structures 120 are disposed. A top surface of the outer interlayer dielectric 142 may have the same height as that of the fourth interlayer dielectric pattern 138. A fifth interlayer dielectric 145 may be disposed at a space between the bitlines BL and a top surface of the bitlines BL. A plurality of contact plugs 171, 172, 173, and 174 may be disposed to penetrate the fifth interlayer dielectric 145 and the outer interlayer dielectric 142. A string selection line contact plug 171 may be electrically connected to the string selection line 167. An upper wordline contact plug 172 may be electrically connected to the upper wordline 165, and a lower wordline contact plug 173 may be electrically connected to the lower wordline 163. The ground selection line contact plug 174 may be electrically connected to the ground selection line 161. The contact plugs 171, 172, 173 and 174 may be electrically connected to a peripheral circuitry through an interconnection 180. A common source line interconnection 175 may be electrically connected to a common source line contact pad 104 through the outer interlayer dielectric 142. The bitline BL may be electrically connected to the peripheral circuitry through a bitline contact plug 181.

According to modified embodiments of the present inventive concept, the common source line may extend to a lower portion of the ground selection line 161.

Figure 4B:
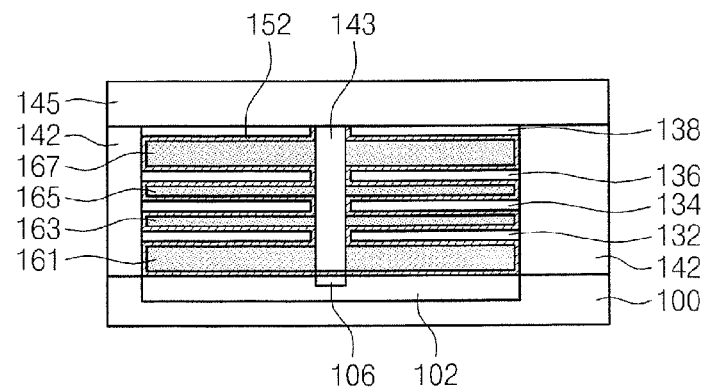
FIGS. 4B, 4C, 4D, and 4E are cross-sectional views taken along the lines I-I', II-II' III-III', and IV-IV' in FIG. 4A, respectively.
Figure 4C:
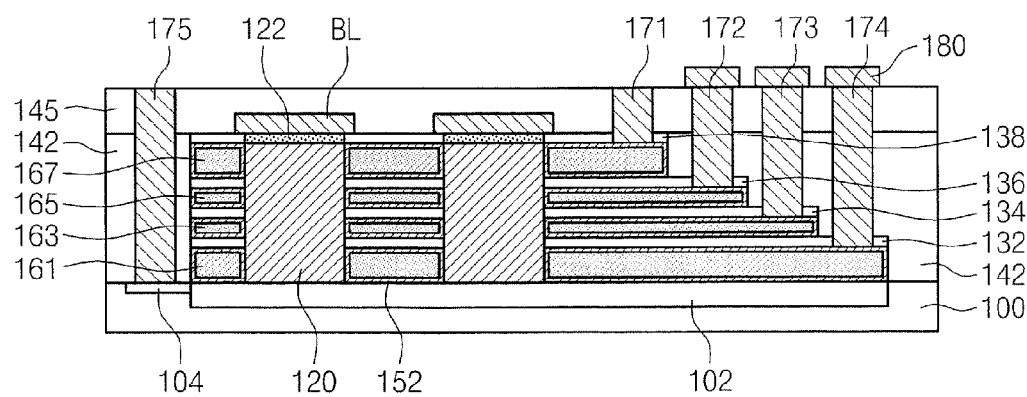
Figure 4D:
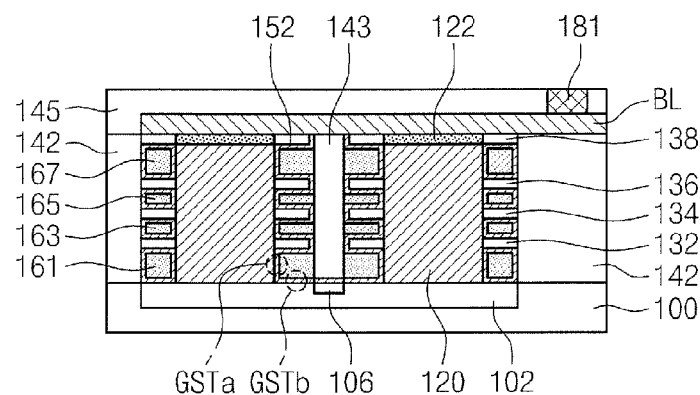
Figure 4E:
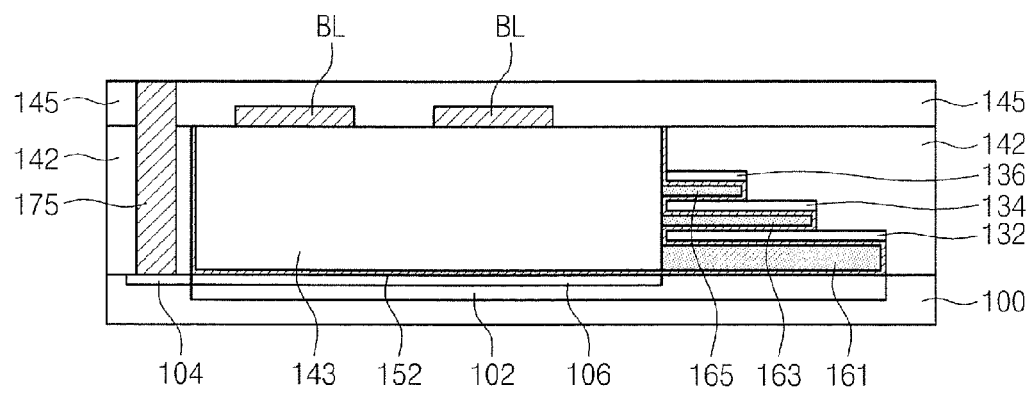

FIGS. 5A to 11A are cross-sectional views sequentially showing methods of forming the semiconductor device of FIG. 4B. FIGS. 5B to 11B are cross-sectional views sequentially showing methods of forming the semiconductor device of FIG. 4C. FIGS. 5C to 11C are cross-sectional views sequentially showing methods of forming the semiconductor device of FIG. 4D. FIGS. 5D to 11D are cross-sectional views sequentially showing methods of forming the semiconductor device of FIG. 4E.

Figure 5A:
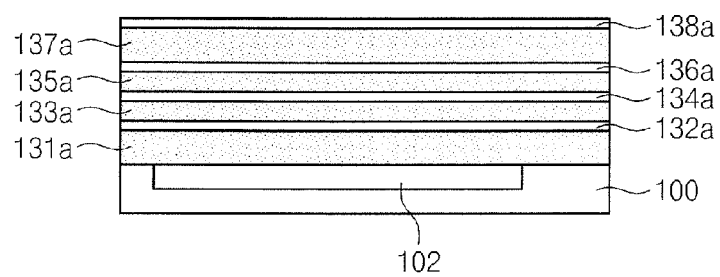
Figure 5B:
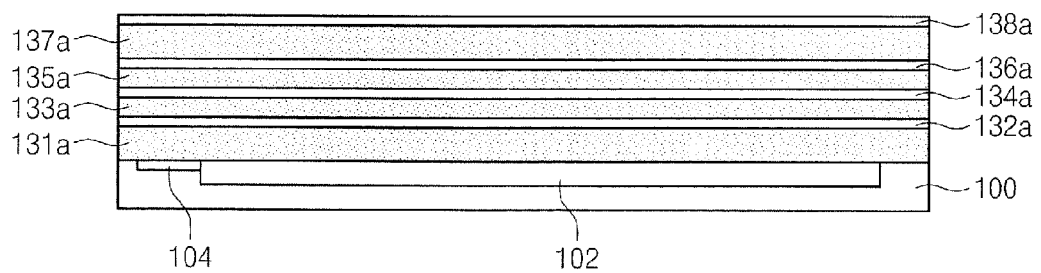
Figure 5C:
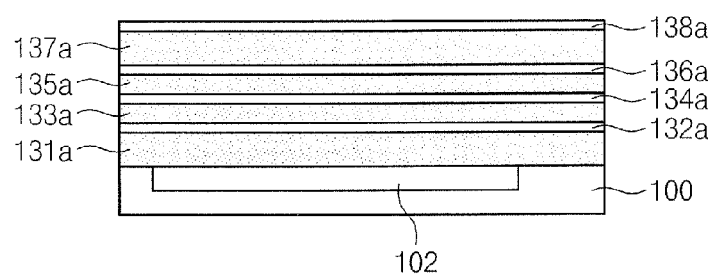
Figure 5D:
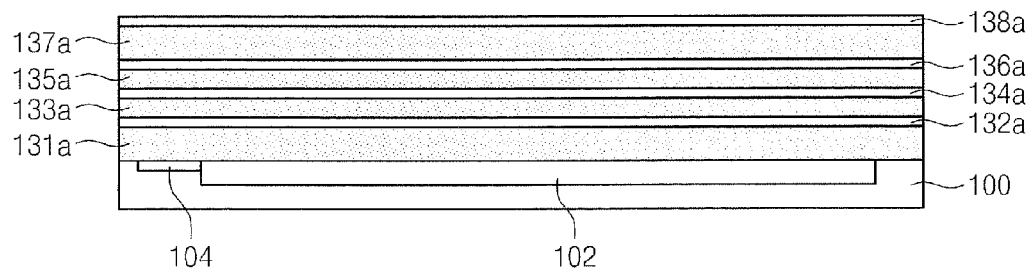

Referring to FIGS. 5A and 5B, a P-type semiconductor layer 102 is formed on a semiconductor substrate 100. If the semiconductor substrate 100 is P-type, an N-well region (not shown) may be further formed between the P-type semiconductor layer 102 and the semiconductor substrate 100. The P-type semiconductor layer 102 may be formed by means of an ion implantation process or a diffusion process.

A common source line contact pad 104 may be formed in the vicinity of the P-type semiconductor layer 102. The common source line contact pad 104 may be an N-type impurity region. The common source line contact pad 104 may be formed by means of an ion implantation process.

A first dummy layer 131a, a first interlayer dielectric 132a, a second dummy layer 133a, a second interlayer dielectric 134a, a third dummy layer 135a, a third interlayer dielectric 136a, a fourth dummy layer 137a, and a fourth interlayer dielectric 138a may be sequentially stacked on the semiconductor substrate 100. The first to fourth dummy layers 131a, 133a, 135a, and 137a may be formed of a material having an etch selectivity with respect to the first to fourth interlayer dielectrics 132a, 134a, 136a, and 138a. For example, the first to fourth dummy layers 131a, 133a, 135a, and 137a may be formed of silicon nitride, while the first to fourth interlayer dielectrics 132a, 134a, 136a, and 138a may be formed of silicon oxide.

Figure 6A:
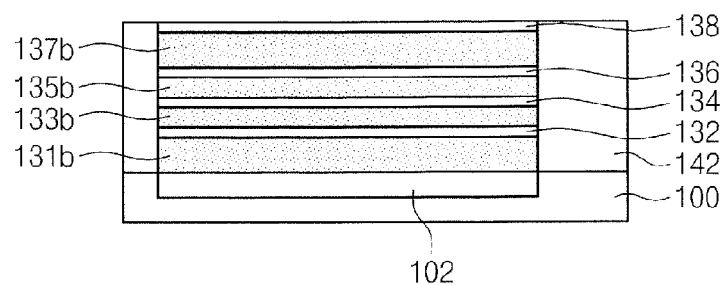
Figure 6B:
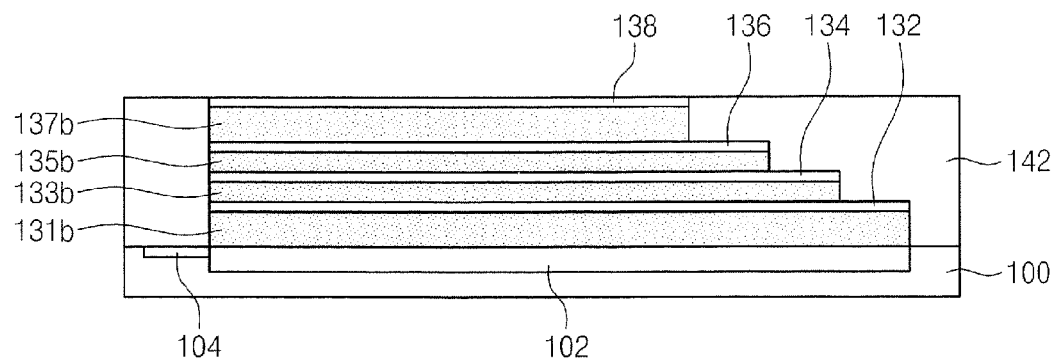
Figure 6C:
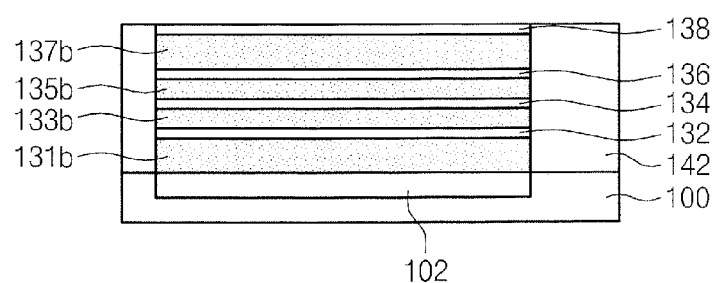
Figure 6D:
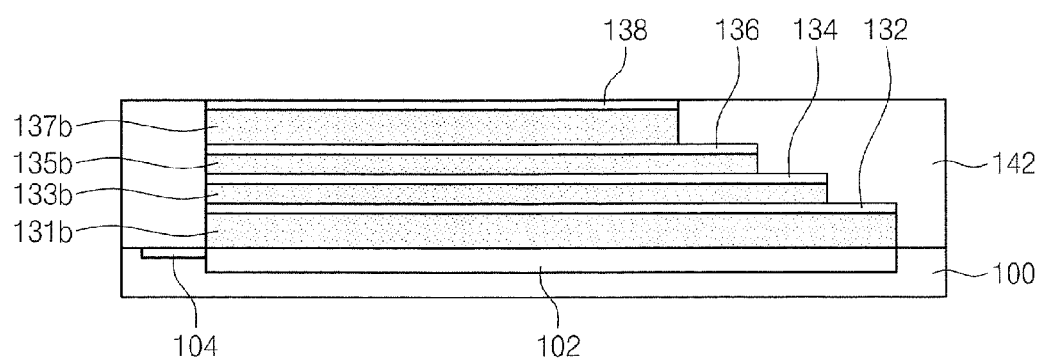
Figure 7A:
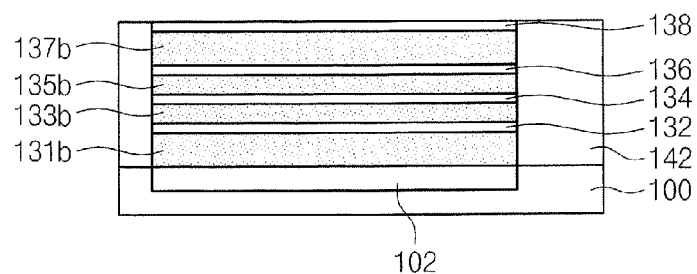
Figure 7B:
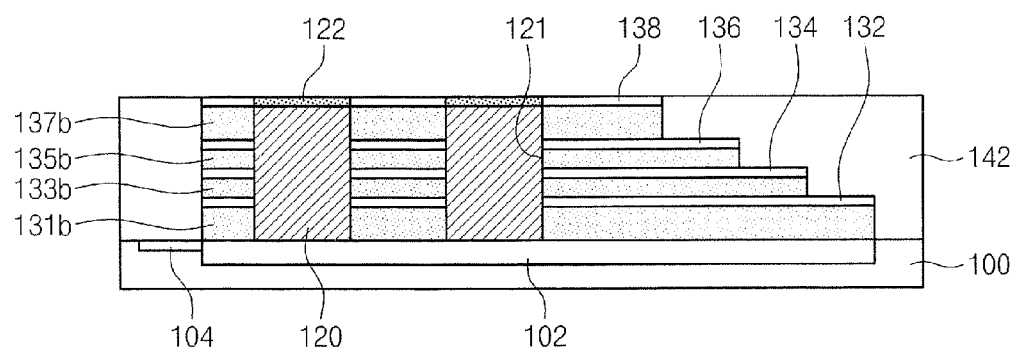
Figure 7C:
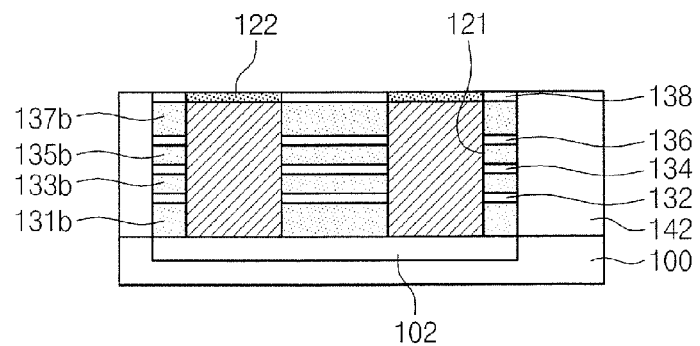
Figure 7D:
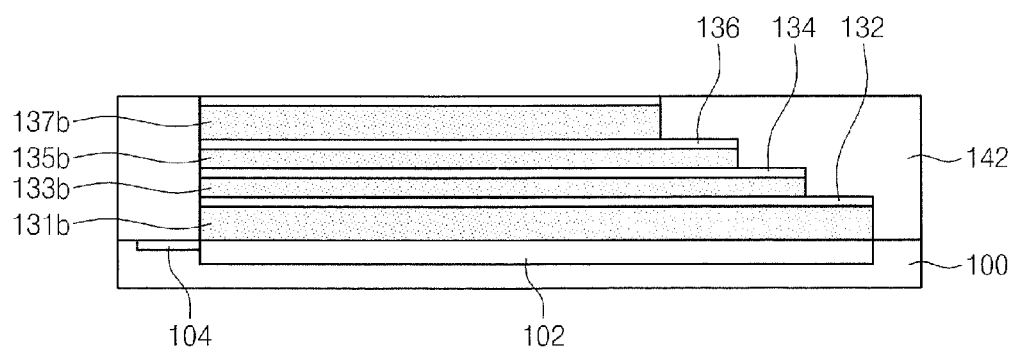
Figure 8A:
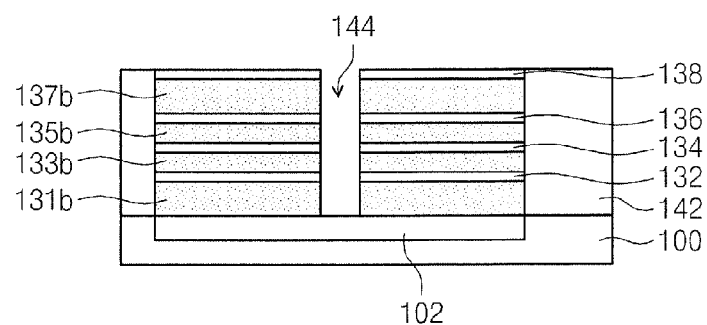
Figure 8B:
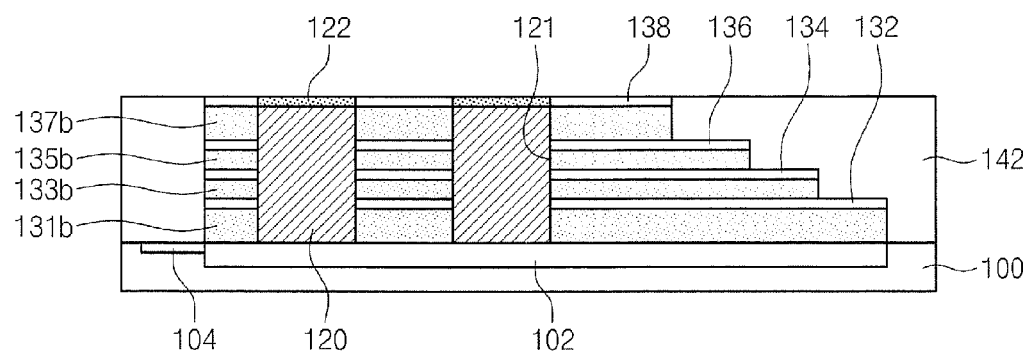
Figure 8C:
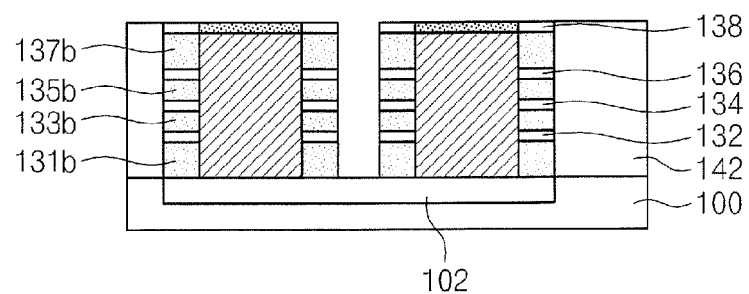
Figure 8D:
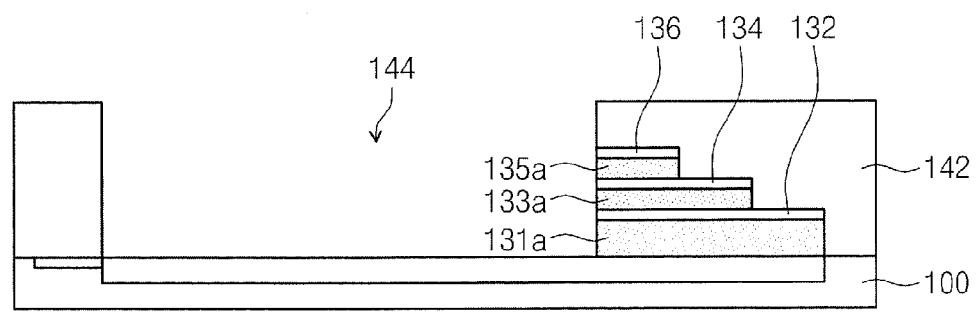
Figure 9A:
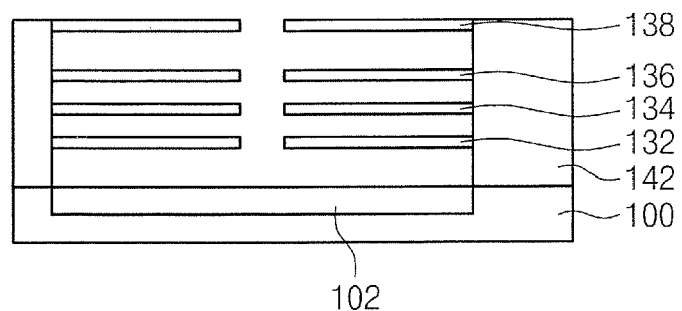
Figure 9B:
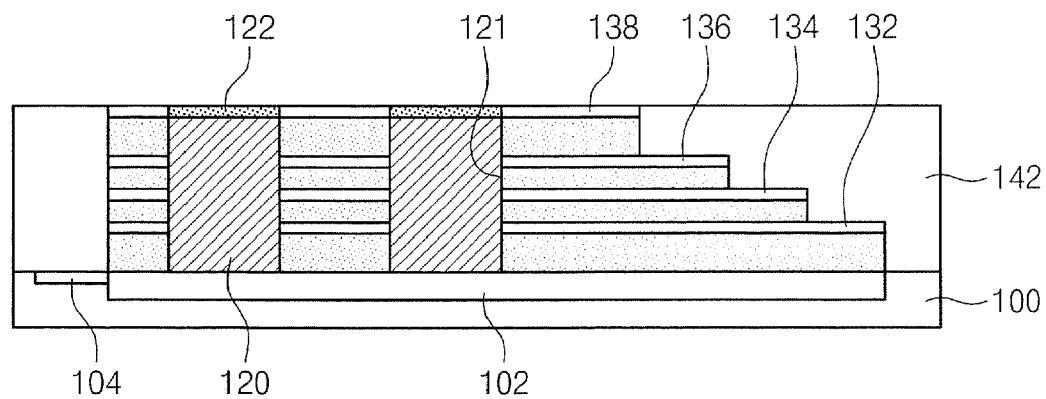
Figure 9C:
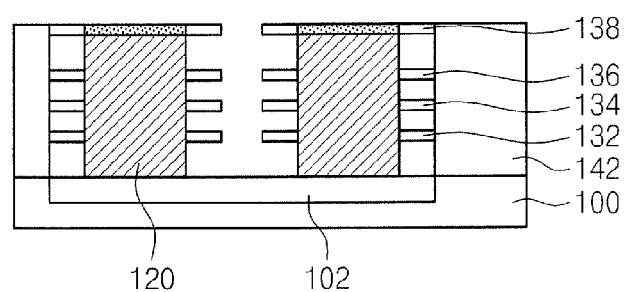
Figure 9D:
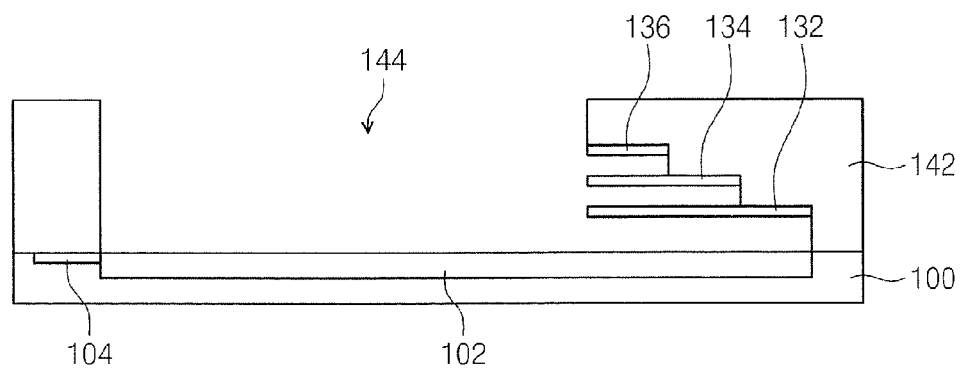
Figure 10A:
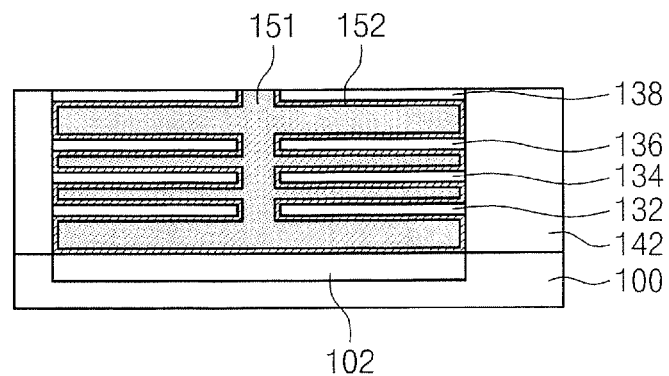
Figure 10B:
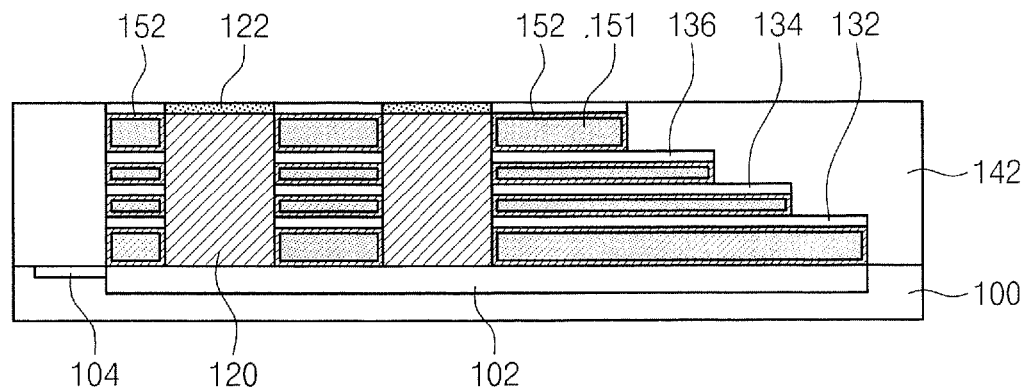
Figure 10C:
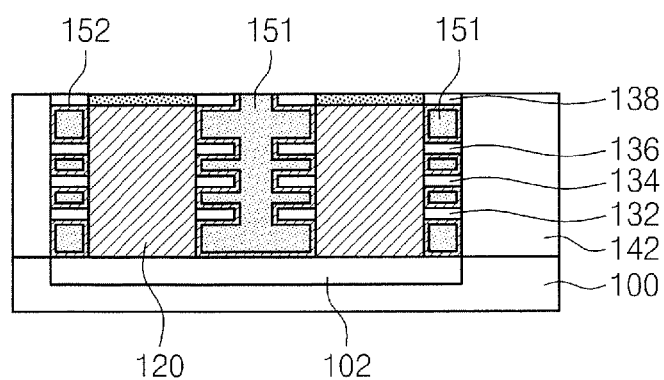
Figure 10D:
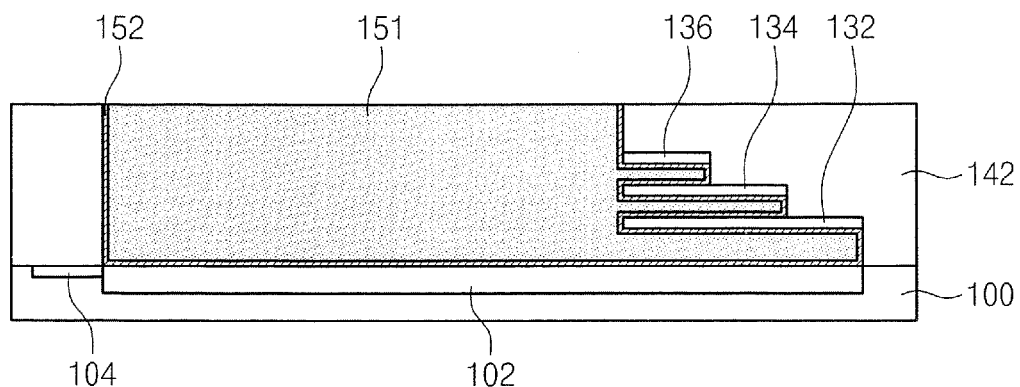
Figure 11A:
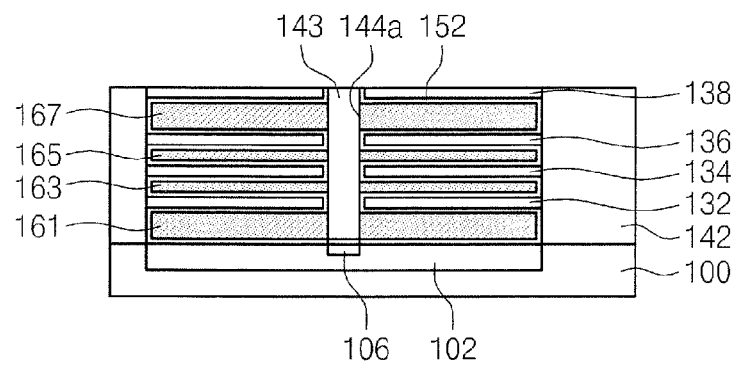
Figure 11B:
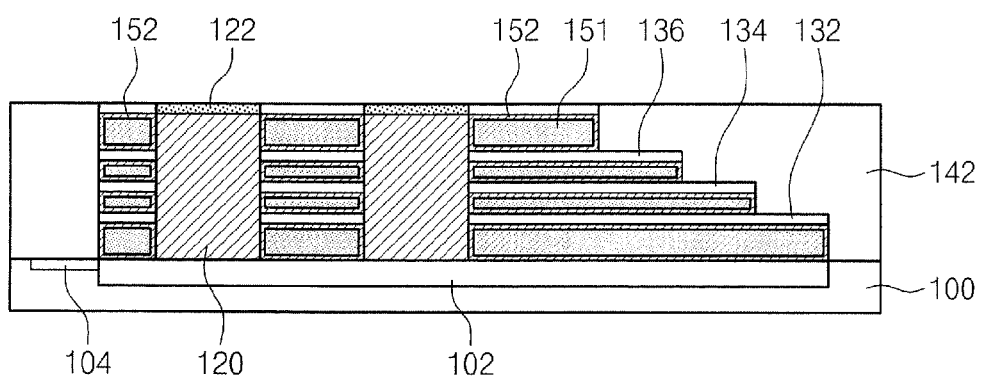
Figure 11C:
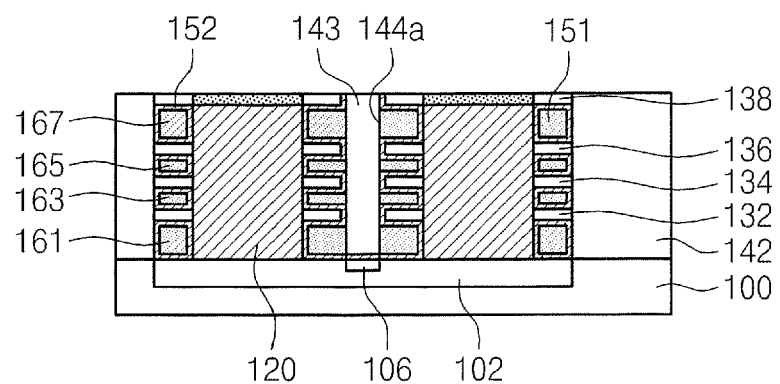
Figure 11D:
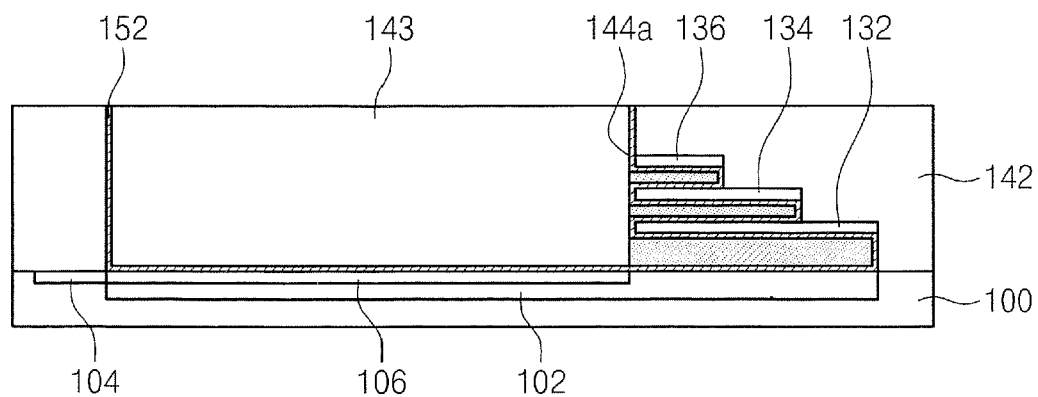

Referring to FIGS. 6A and 6B, the first to fourth dummy layers 131a, 133a, 135a, and 137a and the first to fourth interlayer dielectrics 132a, 134a, 136a, and 138a may be patterned to form first to fourth dummy patterns 131b, 133b, 135b, and 137b and first to fourth interlayer dielectric patterns 132, 134, 136, and 138. The first to fourth dummy patterns 131b, 133b, 135b, and 137b and the first to fourth interlayer dielectric patterns 132, 134, 136, and 138 may be disposed to have a step shape at a partial area. Side surfaces of the first dummy pattern 131b and the first interlayer dielectric 132 may be aligned with each other. Side surfaces of the second dummy pattern 133b and the second interlayer dielectric pattern 134 may be aligned with each other. Side surfaces of the third dummy pattern 135b and the third interlayer dielectric pattern 136 may be aligned with each other. Side surfaces of the fourth dummy pattern 137b and the fourth interlayer dielectric pattern 138 may be aligned with each other.

Next, an outer interlayer dielectric 142 is deposited on the semiconductor substrate 100. The outer interlayer dielectric 142 may be planarized to expose the fourth interlayer dielectric pattern 138.

Referring to FIGS. 7A to 7D, an island-type photoresist pattern (not shown) may be formed on the fourth interlayer dielectric pattern 138 in a matrix. Using the photoresist pattern as an etch mask, the P-type semiconductor layer 102 may be etched down to a top surface of an underlying structure to form a vertical channel hole 121. The vertical channel hole 121 may be filled with a vertical channel structure 120, which may be formed of crystalline or polycrystalline silicon. The vertical channel structure 120 may be doped with P-type impurities. The vertical channel structure 120 may be formed by means of a selective epitaxial growth (SEG) process or a deposition process. A top surface of the vertical channel structure 120 may be planarized to expose the fourth interlayer dielectric pattern 138. A top surface of the vertical channel structure 120 may be doped with N-type impurities to form a drain region 122.

Referring to FIGS. 8A to 8D, the first to fourth dummy patterns 131b, 133b, 135b, and 137b and the first to fourth interlayer dielectric patterns 132, 134, 136, and 138 may be patterned to form a first trench 144 which extends in a first direction. The first trench 144 may be disposed between the vertical channel semiconductor structures 120. A bottom surface of the first trench 144 may be in contact with the P-type semiconductor layer 102.

Referring to FIGS. 9A to 9D, the first to fourth dummy patterns 131b, 133b, 135b, and 137b may be removed by means of wet etch. In the case where first to fourth dummy patterns 131b, 133b, 135b, and 137b are formed of silicon nitride, the wet etch may be performed using phosphoric acid. The wet etch may have a high etch selectivity with respect to the semiconductor substrate 100 and the first to fourth interlayer dielectric patterns 132, 134, 136, and 138.

Referring to FIGS. 10A to 10D, an insulating layer 152 may be conformally formed on the semiconductor substrate 100. The insulating layer 152 may have a uniform thickness on surfaces of the first to fourth interlayer dielectric patterns 132, 134, 136, and 138 and on the semiconductor substrate 100. The insulating layer 152 may have a multi-layered structure of, for example, silicon oxide/silicon nitride/silicon oxide. The silicon nitride layer may function as a charge storage layer. A structure of the insulating layer 152 may be altered variously. The silicon oxide layer may be formed by means of chemical vapor deposition (CVD), atomic layer deposition (ALD) or thermal oxidation. In the case where the silicon oxide layer is formed by means of the thermal oxidation, it may be formed only on surfaces of the exposed semiconductor substrate 100 and the exposed vertical channel structure 120.

A conductive layer 151 may be formed on the semiconductor substrate 100 where the insulating layer 152 is formed. The conductive layer 151 may be formed on the insulating layer 152. The conductive layer 151 may fill up spaces between the first to fourth interlayer dielectric patterns 132, 134, 136, and 138. Moreover, the conductive layer 151 may fill the first trench 144. The conductive layer 151 may include at least one of doped silicon, metal, and meal silicide. The conductive layer 151 may have a multi-layered structure.

The semiconductor substrate 100, where the conductive layer 151 is formed, may be planarized to expose the fourth interlayer dielectric pattern 138. The planarization may be performed by means of a chemical mechanical polishing (CMP) process.

Referring to FIGS. 11A to 11D, a photoresist pattern may be formed on the semiconductor substrate 100. Using the photoresist pattern as an etch mask, the conductive layer 151 filling the first trench 144 may be etched to form a second trench 144a. Thus, the conductive layer 151 may be divided to form a ground selection line 161, a lower wordline 163, an upper wordline 165, and a string selection line 167. A bottom surface of the second trench 144a may match a top surface of the insulating layer 152 disposed on the P-type semiconductor layer 106. A top surface of the P-type semiconductor layer 106 may be doped with N-type impurities by means of an ion implantation process to form a common source line 106. A bottom surface of the common source line 106 may taller than a bottom surface of the P-type semiconductor layer 102. The common source line 106 may be in contact with the common source line contact pad 104.

According to modified embodiments of the present inventive concept, the insulating layer 152 disposed at a bottom surface of the second trench 144a may be selectively removed. A top surface of the exposed P-type semiconductor layer 102 may constitute an impurity region doped with N-type impurities. Metal silicide may be selectively formed on a top surface of the impurity region. The impurity region and the metal silicide may constitute the common source line 106.

A gap-fill interlayer dielectric 143 may be formed on a resultant structure, where the common source line 106 is formed, to fill the second trench 144a. The gap-fill interlayer dielectric 143 may be planarized to expose the fourth interlayer dielectric pattern 138. The planarization may be performed by means of a CMP process. The gap-fill interlayer dielectric 143 may include at least one of silicon oxide, silicon oxynitride, and silicon nitride Returning to FIGS. 4A to 4E, the outer interlayer dielectric 142 is patterned to form a common source line groove (not shown) exposing the common source line contact pad 104. A lower conductive layer (not shown) is formed to fill the common source line groove and the lower conductive layer is planarization-etched to expose an upper surface of the outer interlayer dielectric 142 and to form a common source line interconnection 175. A conductive layer may be formed on the semiconductor substrate 100. The conductive layer may be patterned to form a bitline BL, which extends in a second direction. The bitline BL may be electrically connected to the vertical channel structures arranged in the second direction. The bitline BL may include at least one of metal silicide and metal. A fifth interlayer dielectric 145 may be formed on the semiconductor substrate where the bitline BL is formed. A top surface of the fifth interlayer dielectric 145 may be planarized.

An etching process using a photoresist pattern as an etch mask is performed to form a string selection line contact hole (not shown), an upper wordline contact hole (not shown), a lower wordline contact hole (not shown), and a ground selection contact hole (not shown). The string selection contact hole may be formed to expose the string selection line 167 at the step-shaped region. The upper wordline contact hole may be formed to expose the upper wordline 165. The lower wordline contact hole may be formed to expose the lower wordline 163. The ground selection line contact hole may be formed to expose the ground selection line 161. A bitline contact plug 181 may be connected to the bitline BL through the fifth interlayer dielectric 145.

A conductive material may be formed on the semiconductor substrate 100 where the contact holes are formed. The top surface of the semiconductor substrate 100 may be planarized to form a string selection line contact plug 171, an upper wordline contact plug 172, a lower wordline contact plug 173, and a ground selection line contact plug 174. The contact plugs 171, 172, 173, and 174 may be electrically connected to a peripheral circuitry.

According to modified embodiments of the present inventive concept, the positions of the contact plugs 171, 172, 173 and 174, a running direction of the interconnection, the interconnection-disposed plane may be altered variously.

A three-dimensional semiconductor device according to other embodiments of the present inventive concept and a method of forming the same will now be described below in detail.

Figure 12A:
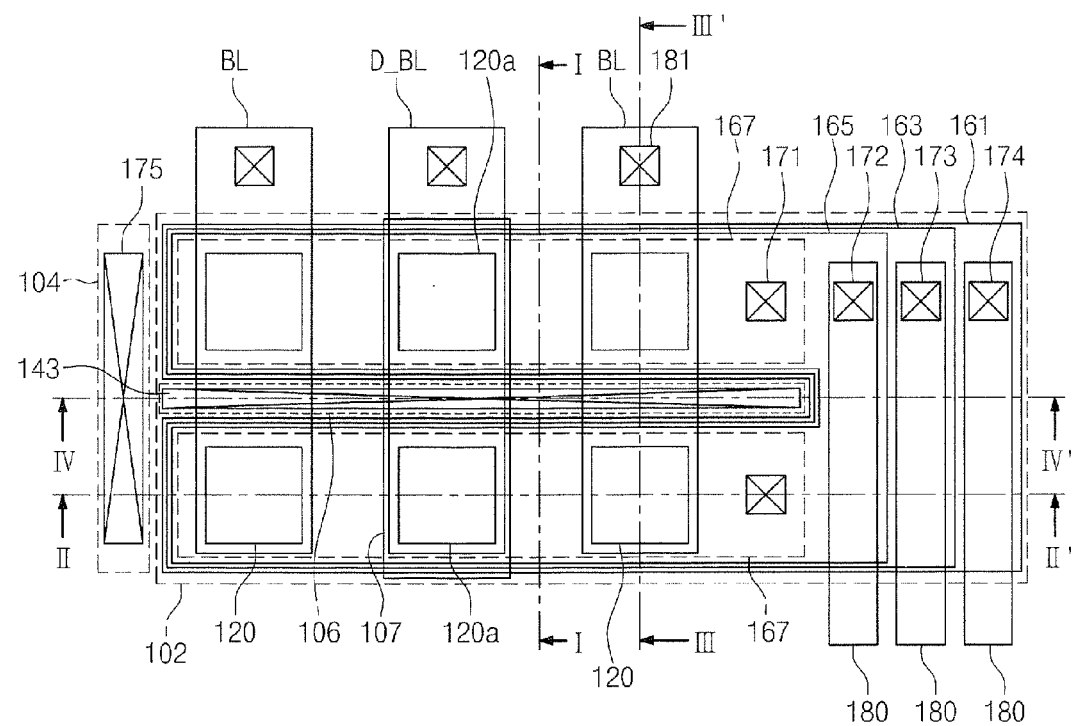
FIG. 12A is a top plan view of a semiconductor device according to some embodiments of the present inventive concept.
Figure 12B:
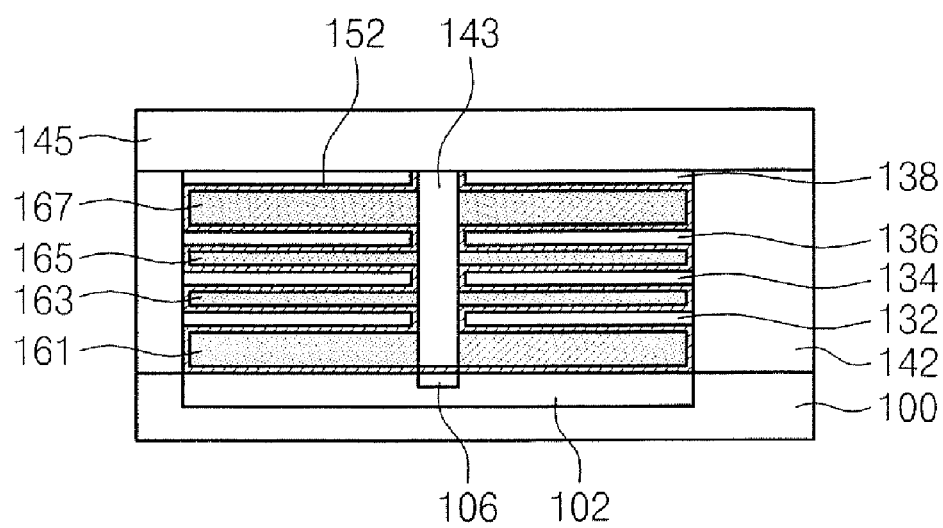
FIGS. 12B, 12C, 12D, and 12E are cross-sectional views taken along the lines I-I', II-II', III-III', and IV-IV' in FIG. 12A, respectively.
Figure 12C:
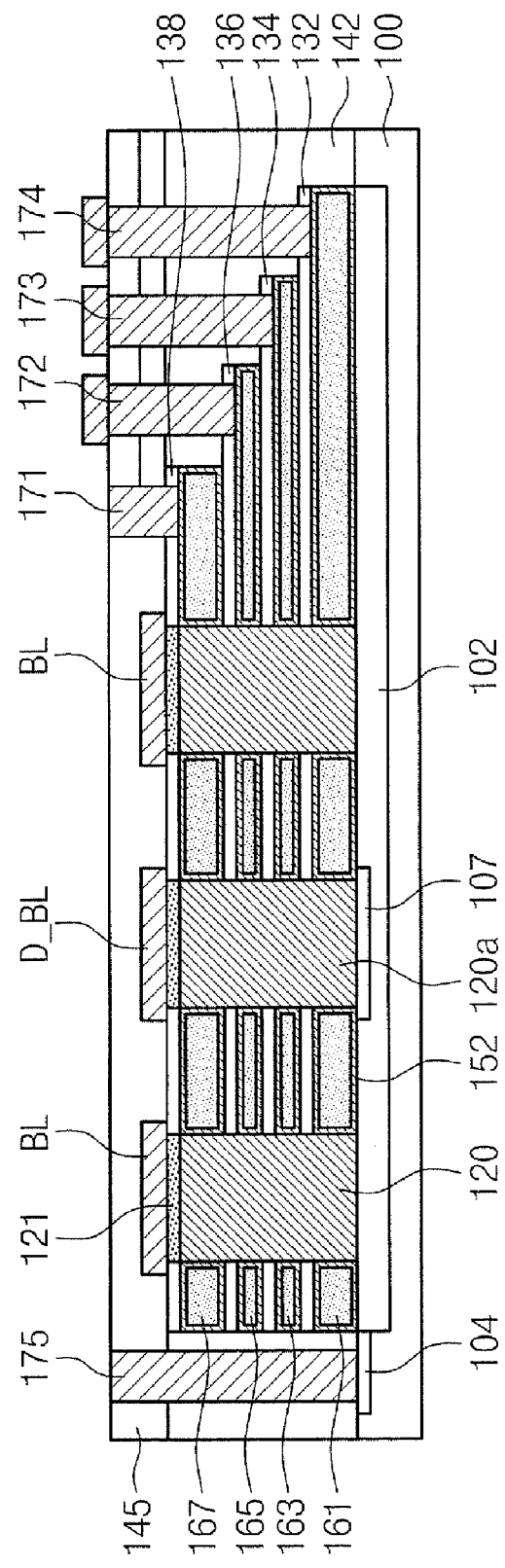
Figure 12D:
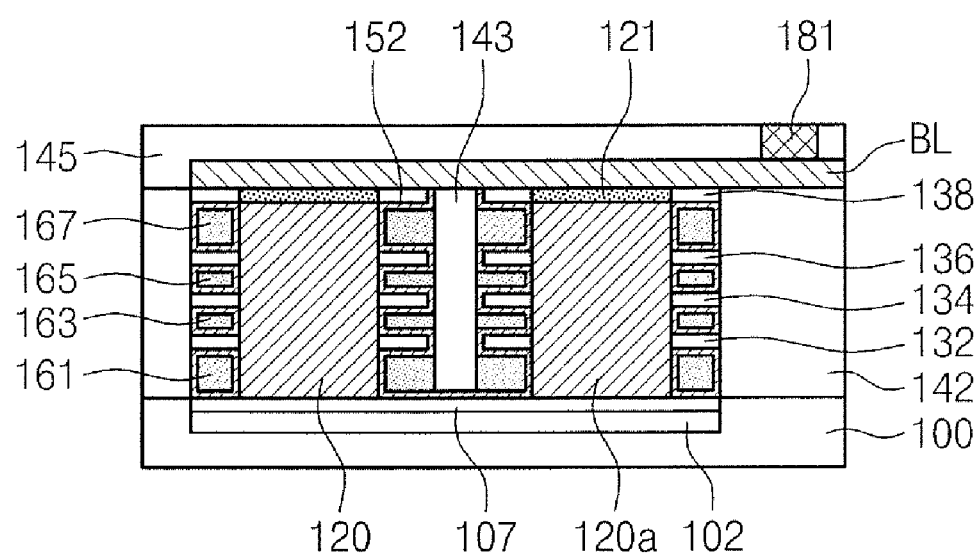
Figure 12E:
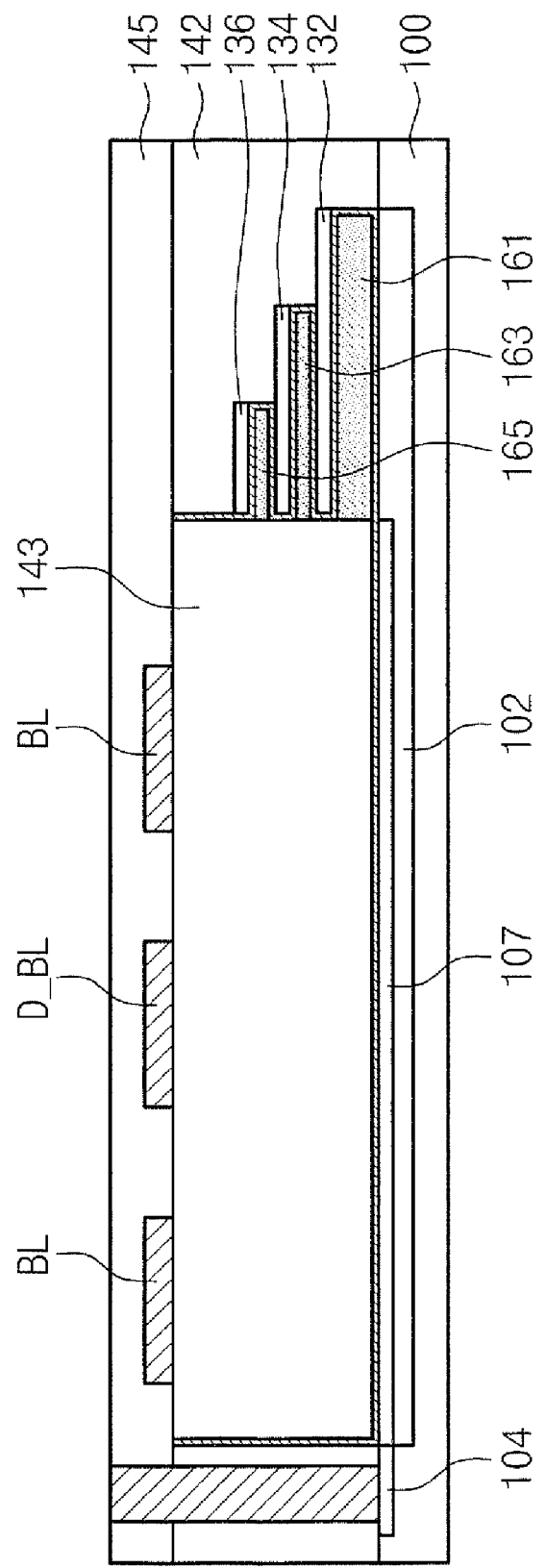

FIG. 12A is a top plan view of a semiconductor device according to some embodiments of the present inventive concept. FIGS. 12B, 12C, 12D, and 12E are cross-sectional views taken along the lines I-I', II-II', III-III', and IV-IV' in FIG. 12A, respectively.

Referring to FIGS. 12A to 12E, a three-dimensional semiconductor device includes a semiconductor substrate 100, vertical channel structures 120 arranged on the semiconductor substrate 100 in a matrix, a P-type semiconductor layer 102 which is in direct contact with the vertical channel structures 120 and disposed on the semiconductor substrate 100, and a common source line 106 disposed on the semiconductor substrate 100 between the vertical channel structures 120. The common source line 106 may be in contact with the P-type semiconductor layer 102 to extend in a first direction. An auxiliary common source line 107 may be disposed on the semiconductor substrate 100 to cross the common source line 106.

The P-type semiconductor layer 102 may be disposed at a predetermined region where the vertical channel structures 120 are disposed. The P-type semiconductor layer 102 may be an impurity region doped with P-type impurities. The vertical channel structures 120 may include dummy vertical channel structures 120a disposed in a second direction. The auxiliary common source line 107 may extend at a region below the dummy vertical channel structure 120a in a second direction intersecting the first direction. The common source line 106 and the auxiliary common source line 107 may be cross-coupled.

The vertical channel structures 120 may be arranged on the P-type semiconductor layer 102 in a matrix. The vertical channel structures 120 may be each made of silicon doped with P-type impurities. The vertical channel structure 120 may be made of crystalline or polycrystalline silicon. The dummy vertical channel structures 120a may not function as a memory device.

The common source line 106 may extend at the semiconductor substrate 100 between the vertical channel structures 120 in a first direction. The common source line 106 The common source line 106 may be a region formed by doping the semiconductor substrate 100 with N-type impurities. According to modified embodiments of the present inventive concept, the common source line 106 may include at least one of an impurity region, doped polysilicon, metal silicide, and metal. A top surface of the P-type semiconductor layer 102 may have the same height as that of the common source line 106.

A common source line contact pad 104 may be disposed in the vicinity of the P-type semiconductor layer 102 to be electrically connected to the common source line 106. The common source line contact pad 104 may include the same material as the common source line 106. The common source line contact pad 104 may be, for example, an N-type impurity region. The auxiliary common source line 107 may include the same material the common source line pad 104. The auxiliary common source line 107 and the common source line contact pad 104 may be formed at the same time.

Ground selection lines 161, wordlines 163 and 165, and string selection lines 167 may be sequentially stacked on the P-type semiconductor layer 102 and extend in the first direction. The ground selection lines 161 may run parallel to each other on one plane. The ground selection lines 161 may be connected to each other at their one end. The ground selection lines 161, the wordlines 163 and 165, and the string selection lines 167 may have a step shape at their one end.

The wordlines 163 and 165 may be disposed on a plurality of planes. The wordlines 163 and 165 disposed on one plane may be connected to each other at their one end. In this embodiment, only the wordlines 163 and 165 of a double-layered structure are shown for the convenience of description. Side surfaces of the wordlines 163 and 165 and the ground selection lines 161 may be vertically aligned with each other. Side surfaces of the wordlines 163 and 165 and the string selection lines 167 may be vertically aligned with each other. The ground selection lines 161, the wordlines 163 and 165, and the string selection lines 167 may be each made of a conductive material. The ground selection lines 161, the wordlines 163 and 165, and the string selection lines 167 may include at least one of doped polysilicon, metal, and metal silicide.

The vertical channel structure 120 may be disposed to perpendicularly penetrate the string selection line 167, the wordlines 163 and 165, the ground selection line 161. An insulating layer 152 may be disposed between the vertical channel structure 120 and the string selection line 167, between the vertical channel structure 120 and the wordlines 163 and 165, and between the vertical channel structure 120 and the ground selection line 160. The insulating layer 152 between the vertical channel structure 120 and the string selection line 167 may act as a gate insulating layer. The insulating layer 152 between the vertical channel structure 120 and the wordlines 163 and 165 may act as a charge storage layer of cell transistors. The insulating layer 152 between the vertical channel structure 120 and the ground selection line 161 may act as a gate insulating layer of the ground selection transistor GSTa. The insulating layer 152 may extend between the ground selection line 161 and the semiconductor substrate 100. The insulating layer 152 on the semiconductor substrate 100 may act as a gate insulating layer of an auxiliary ground selection transistor GSTb. The insulating layer 152 may include a multi-layered structure of silicon oxide/silicon nitride/silicon oxide to act as the charge storage layer. The structure of the insulating layer 152 may be altered variously.

The wordlines 163 and 165 may include a lower wordline 163 and an upper wordline 165. A first interlayer dielectric pattern 132 may be disposed between the ground selection line 161 and the lower wordline 163, and a second interlayer dielectric pattern 134 may be disposed between the ground selection line 161 and the upper wordline 165. A third interlayer dielectric pattern 136 may be disposed between the upper wordline 165 and the string selection line 167. A fourth interlayer dielectric pattern 138 may be disposed on the string selection line 167.

The insulating layer 152 may extend to be disposed between the ground selection line 161 and the first interlayer dielectric pattern 132. The insulating layer 152 may extend to be disposed between the first interlayer dielectric pattern 132 and the lower wordline 163. The insulating layer 152 may extend to be disposed between the lower wordline 163 and the second interlayer dielectric pattern 134. The insulating layer 152 may extend to be disposed between the second interlayer dielectric pattern 134 and the upper wordline 165. The insulating layer 152 may extend to be disposed between the upper wordline 165 and the third interlayer dielectric pattern 136. The insulating layer 152 may extend to be disposed between the third interlayer dielectric pattern 136 and the string selection line 167. The insulating layer 152 may extend to be disposed between the string selection line 167 and the fourth interlayer dielectric pattern 138.

A gap-fill interlayer dielectric 143 may be disposed between adjacent wordlines 163 and 165 on the common source line 106. The gap-fill interlayer dielectric 143 may extend in the first direction. The gap-fill interlayer dielectric 143 may include silicon oxide. A bottom surface of the gap-fill interlayer dielectric 143 may be in contact with the insulating layer 152. A top surface of the gap-fill interlayer dielectric 143 may have the same height as that of the fourth interlayer dielectric pattern 138.

A drain region 122 may be formed on the vertical channel structures 120. The drain region 122 may be an impurity region doped with N-type impurities. A top surface of the vertical channel structures 121 may have the same height as that of the gap-fill interlayer dielectric 143. A bitline BL may be disposed on the drain region 122. The bitline may extend in the second direction intersecting the first direction.

An outer interlayer dielectric 142 may be disposed on the semiconductor substrate 100 at an outer region except a predetermined region where the vertical channel structures 120 are disposed. A top surface of the outer interlayer dielectric 142 may have the same height as that of the fourth interlayer dielectric pattern 138. A fifth interlayer dielectric 145 may be disposed at a space between the bitlines BL and a top surface of the bitlines BL. A plurality of contact plugs 171, 172, 173 and 174 may be disposed to penetrate the fifth interlayer dielectric 145 and the outer interlayer dielectric 142. A string selection line contact plug 171 may be electrically connected to the string selection line 167. An upper wordline contact plug 172 may be electrically connected to the upper wordline 165, and a lower wordline contact plug 173 may be electrically connected to the lower wordline 163. The ground selection line contact plug 174 may be electrically connected to the ground selection line 161. The contact plugs 171, 172, 173 and 174 may be electrically connected to a peripheral circuitry through an interconnection 180. A common source line interconnection 175 may be electrically connected to a common source line contact pad 104 through the outer interlayer dielectric 142. The bitline BL may be electrically connected to the peripheral circuitry through a bitline contact plug 181.

According to modified embodiments of the present inventive concept, the common source line 106 may extend to a lower portion of the ground selection line 161.

As set forth in FIGS. 5 to 11, the three-dimensional semiconductor device may be formed through the same process. The auxiliary common source line 107 may be formed at the same time as the common source line contact pad 104.

Figure 13:
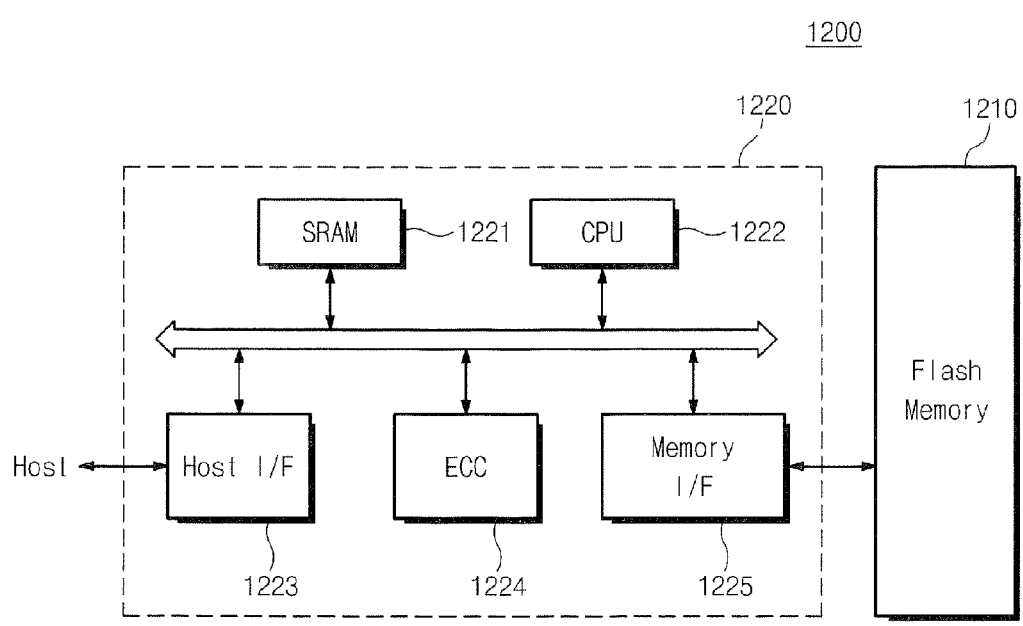
FIG. 13 is a block diagram illustrating an example of a memory card with a flash memory device according to the present inventive concept.

FIG. 13 is a block diagram illustrating an example of a memory card 1200 with a flash memory device according to the present inventive concept.

Referring to FIG. 13, the memory card 1200 for supporting mass data storage capability is provided with a flash memory device 1210 according to the present inventive concept. The memory card 1200 includes a memory controller 1220 configured to control all data exchange between a host and the flash memory device 1210.

An SRAM 1221 is used as an operation memory of a processing unit 1222. A host interface 1223 includes a data exchange protocol of a host connected to the memory card 1200. An error correction code block (ECC) 1224 is configured to detect and correct an error included in data read out of the flash memory 1210. A memory interface 1225 is configured to interface with the flash memory 1210. A processing unit 1222 is configured to perform all control operations for data exchange of the memory controller 1120. Although not shown in this figure, it will be apparent to a person of ordinary skill in the art that the memory card 1200 may be provided with a ROM (not shown) storing code data for interface with the host therein.

According to a flash memory device and a memory card or a memory system of the present inventive concept, a high-reliable memory system may be provided through a flash memory device 1210 with dummy cells having improved erase characteristics. Especially, a flash memory device according to the present inventive concept may be provided for a recently attractive memory system such as a solid-state disk (SSD). In this case, errors arising from a dummy cell may be cut off to achieve a high-reliable memory system.

Figure 14:
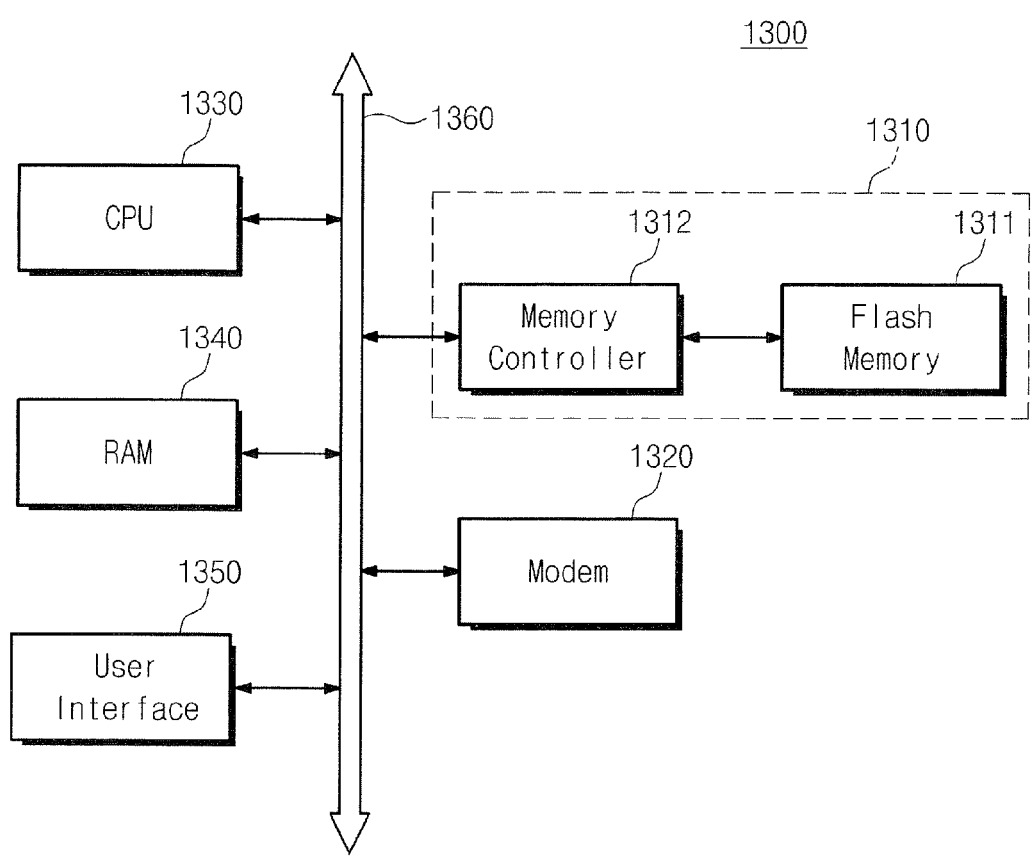
FIG. 14 is a block diagram of a data processing system including a flash memory system according to the present inventive concept.

FIG. 14 is a block diagram of a data processing system 1300 including a flash memory system 1310.

Referring to FIG. 14, the flash memory system 1310 according to the present inventive concept may be mounted in a data processing system such as a mobile device or a desktop computer. The data processing system 1300 includes the flash memory system 1310 and a modem 1320, a central processing unit (CPU) 1330, a RAM 1340, and a user interface 1350 which are each electrically connected to a system bus 1360. The flash memory system 1310 may be organized with the same structure as the above-mentioned memory system or flash memory system. Data processed by the CPU 1330 or externally input data is stored in the flash memory system 1310. The flash memory system 1310 may constitute a solid-state disk (SSD). In this case, the data processing system 1300 may stably store massive data in the flash memory system 1310. Moreover, with the improvement in reliability of the foregoing semiconductor device, the flash memory system 1310 may reduce resources required in error correction. Thus, a high-speed data exchange function may be provided to the data processing system 1300. Although not shown in this figure, it will be apparent to a person of ordinary skill in the art that the data processing system 1300 may be provided with an application chipset, a camera image processor (CIS), and an input/output device.

A flash memory device or a memory system according to embodiments of the present inventive concept may be mounted using various forms of packages. The three-dimensional semiconductor device of the present inventive concept may be mounted using packages, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

As explained so far, a semiconductor memory device according to embodiments of the present inventive concept includes a P-type semiconductor layer that is a contact portion with a vertical channel structure. A common source line is disposed at the P-type semiconductor layer where vertical channel structures are disposed. The common source line may include an N-type semiconductor layer. Thus, in the case where the P-type semiconductor layer is inverted to form a horizontal channel, resistance between the P-type semiconductor layer and the common source line is significantly reduced. Moreover, resistance change according to positions is also reduced. As a result, malfunction and current dispersion resulting from resistance between the vertical channel structure and the common source line are reduced to improve reliability of the semiconductor memory device.

Although the present inventive concept has been described in connection with the embodiment of the present inventive concept illustrated in the accompanying drawings, it is not limited thereto. It will be apparent to those skilled in the art that various substitutions, modifications and changes may be made without departing from the scope and spirit of the inventive concept.

What is claimed is:

1. A three-dimensional semiconductor device comprising:
   a semiconductor substrate;
   vertical channel structures arranged on the semiconductor substrate in a matrix;
   a P-type semiconductor layer disposed at the semiconductor substrate to be in direct contact with the vertical channel structures; and
   a common source line disposed at the semiconductor substrate between the vertical channel structures to be contact with the P-type semiconductor layer.

2. The three-dimensional semiconductor device as set forth in claim 1, wherein the common source line is doped with N-type impurities.

3. The three-dimensional semiconductor device as set forth in claim 1, further comprising:
   a common source line pad disposed on the semiconductor substrate outside an array region where the vertical channel structures are disposed.

4. The three-dimensional semiconductor device as set forth in claim 1, wherein the common source line extends in one direction.

5. The three-dimensional semiconductor device as set forth in claim 1, wherein the common source line is disposed in a matrix.

6. The three-dimensional semiconductor device as set forth in claim 1, further comprising:
   a ground selection line disposed on the P-type semiconductor layer to invert a surface of the P-type semiconductor layer.

7. The three-dimensional semiconductor device as set forth in claim 1, wherein each of the vertical channel structures has a pillar shape or a macaroni shape.

8. The three-dimensional semiconductor device as set forth in claim 1, wherein an interlayer dielectric is disposed on the common source line.

9. The three-dimensional semiconductor device as set forth in claim 1, wherein the vertical channel structures include dummy vertical channel structures, and the common source line extends to a lower portion of the dummy vertical channel structure.

10. The three-dimensional semiconductor device as set forth in claim 1, wherein the common source line further includes at least one of metal silicide and metal.

* * * * *